United States Patent [19]

Nogle

[11] Patent Number: 5,446,400

[45] Date of Patent: Aug. 29, 1995

[54] GTL COMPATIBLE BICMOS INPUT STAGE

[75] Inventor: Scott G. Nogle, Austin, Tex.

[73] Assignee: Motorola Inc., Schaumburg, Ill.

[21] Appl. No.: 334,906

[22] Filed: Nov. 7, 1994

[51] Int. Cl.[6] ............................................. H03K 17/16
[52] U.S. Cl. .......................................... 326/64; 326/21; 326/127
[58] Field of Search .................. 326/21, 31, 63-64, 326/70, 84, 109, 126, 127

[56] References Cited

U.S. PATENT DOCUMENTS

| | | | |
|---|---|---|---|
| 5,140,196 | 8/1992 | Shepherd | 326/64 |
| 5,204,557 | 4/1993 | Nguyen | 326/70 X |
| 5,315,179 | 5/1994 | Pelley, III et al. | 307/475 |
| 5,329,182 | 7/1994 | Yu | 326/126 X |
| 5,349,253 | 9/1994 | Ngo et al. | 326/127 X |
| 5,381,060 | 1/1995 | Ainspan et al. | 326/21 X |

*Primary Examiner*—David R. Hudspeth
*Attorney, Agent, or Firm*—Daniel D. Hill

[57] ABSTRACT

A BICMOS input stage includes a level shifting stage (35) and a level converter/buffer circuit (60). The input stage receives a single-ended GTL level input signal and a reference voltage, and in response, provides differential BICMOS level output signals. The input stage operates over a wide range of values for the reference voltage, does not require the generation of complex bias voltages, and provides well controlled output signals.

14 Claims, 3 Drawing Sheets

FIG. 1 —PRIOR ART—

GTL COMPATIBLE BICMOS INPUT STAGE

FIELD OF THE INVENTION

This invention relates generally to input circuits, and more particularly, to a GTL compatible BICMOS input stage.

BACKGROUND OF THE INVENTION

GTL (Gunning Transceiver Logic) is a logic type that is becoming increasingly popular. HSTL (High Speed Transistor Logic) is included within the GTL family. Both GTL and HSTL have a logic swing that is comparable to ECL (emitter-coupled logic), have relatively low power consumption, high speed, and do not require BICMOS. There are minor differences between the logic level voltages for GTL and HSTL. For example, the logic high level voltage for GTL may equal between 1.14 and 1.26 volts with a reference voltage of between 0.55 and 0.9, while the logic high level voltage for HSTL may equal between 1.4 volts and 1.6 with a reference voltage of between 0.68 and 0.9 volts. Note that a BICMOS circuit includes both bipolar and CMOS (complementary metal-oxide semiconductor) transistors on the same integrated circuit.

FIG. 1 illustrates in partial schematic diagram form and partial logic diagram form, prior art input stage 10 that receives a GTL level input signal and buffers and level converts the input signal to BICMOS levels. BICMOS logic levels swing from a logic high voltage equal to about a $V_{BE}$ (base-emitter diode voltage drop) below a positive power supply voltage, to a logic low voltage equal to about ground. Input stage 10 includes level shift circuit 12 and input buffer 14 and receives single-ended GTL level input signal $A_{PAD}$, reference voltage $V_{REF}$, and bias voltages $N_{BIAS}$ and $A_{BIAS}$. In response, input stage 10 provides differential BICMOS level output signals A and A*. Note that an asterisk (*) after a signal name indicates that the signal is a logical complement of a signal having the same name but lacking the asterisk (*). Level shift circuit 12 includes P-channel transistors 16, 17, 21, and 22, NPN transistors 18 and 23, and N-channel transistors 19 and 24. Input buffer 14 includes load network 26, NPN transistors 27 and 28, N-channel transistor 29, and inverters 31 and 32. Differential amplifier 25 comprises load network 26, NPN transistors 27 and 28, and N-channel transistor 29. Input stage 10 is supplied with a power supply voltage equal to about 3 volts.

Reference voltage $V_{REF}$ is externally provided by the user, and is typically set at the midpoint of a logic swing of input signal $A_{PAD}$. If the voltage of input signal $A_{PAD}$ is lower than the voltage of reference voltage $V_{REF}$, then more current is steered through NPN transistor 28 than through NPN transistor 27, and output signal A* is a logic high voltage and output signal A is a logic low voltage. If the voltage of input signal $A_{PAD}$ is higher than the voltage of reference voltage $V_{REF}$, then more current is steered through NPN transistor 27 than through NPN transistor 28, and output signal A* is a logic low voltage and output signal A is a logic high voltage.

An input stage, such as prior art input stage 10, must function through a range of possible voltages for the various input signals. NPN transistors 18 and 23 of level shift circuit 12 function to lower the voltages of input signal $A_{PAD}$ and reference voltage $V_{REF}$ before applying them to NPN transistors 27 and 28. This allows input stage 10 to function properly for relatively low values of reference voltage $V_{REF}$. However, input stage 10 is not able to operate adequately for relatively high values of $V_{REF}$. For example, when reference voltage $V_{REF}$ is equal to about one volt, P-channel transistors 17 and 22 cannot be biased properly with a power supply voltage ($V_{DD}$) equal to about 3 volts. In addition, bias voltage $A_{BIAS}$ is required to follow $V_{DD}$, complicating circuit design of an $A_{BIAS}$ generation circuit.

SUMMARY OF THE INVENTION

Accordingly, there is provided, in one form, a level shifting circuit having a current source, first and second transistors, first, second, and third load elements, and first, second, and third diodes. The current source is for providing a current. The first transistor has a first current electrode coupled to the current source, a control electrode for receiving an input signal, and a second current electrode for providing a first intermediate level signal. The second transistor has a first current electrode coupled to the first current electrode of the first transistor, a control electrode for receiving a reference voltage, and a second current electrode for providing a second intermediate level signal. The first load element has a first terminal coupled to the second current electrode of the first transistor, and a second terminal. The second load element has a first terminal coupled to the second current electrode of the second transistor, and a second terminal coupled to the second terminal of the first load element. The third load element has a first terminal coupled to the second terminals of both the first and second load elements. The first diode has a first terminal coupled to the second current electrode of the first transistor, and a second terminal coupled to the second terminal of the third load element. The second diode has a first terminal coupled to the second current electrode of the second transistor, and a second terminal coupled to the second terminal of the third load element. The third diode has a first terminal coupled to the second terminal of the third load element, and a second terminal coupled to a power supply voltage terminal. These and other features and advantages will be more clearly understood from the following detailed description taken in conjunction with the accompanying drawings.

DESCRIPTION OF A PREFERRED EMBODIMENT

Generally, the present invention provides an input stage having a level shifting stage and a level converter/buffer circuit. The input stage receives a single-ended GTL level input signal and a reference voltage, and in response, provides differential BICMOS level output signals. The input stage operates over a wide range of values for the reference voltage, does not require the generation of complex bias voltages, and provides output signals with well controlled voltage levels.

Figure 1:
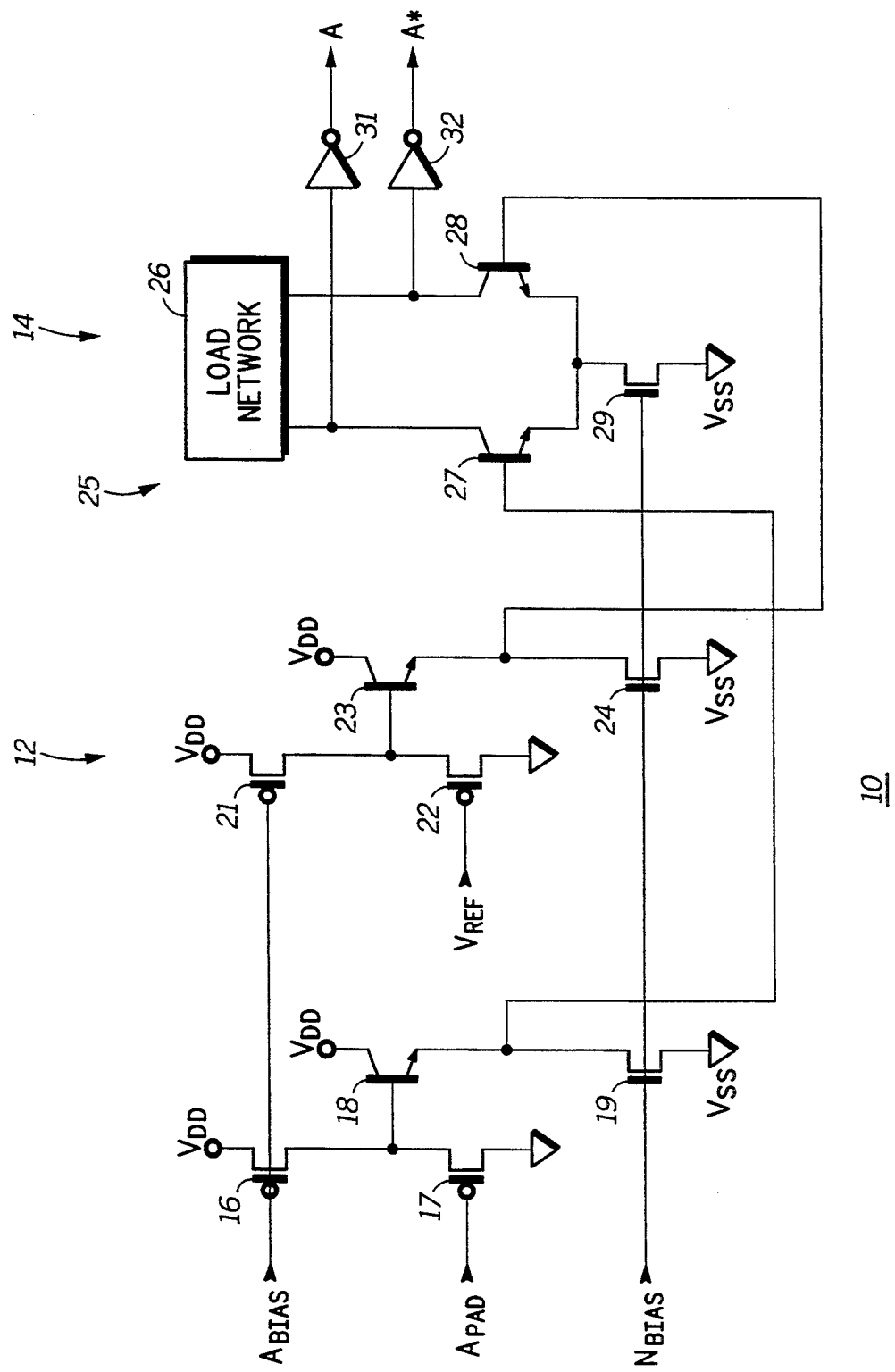
FIG. 1 illustrates in partial schematic diagram form and partial logic diagram form, a prior art input stage.
Figure 2:
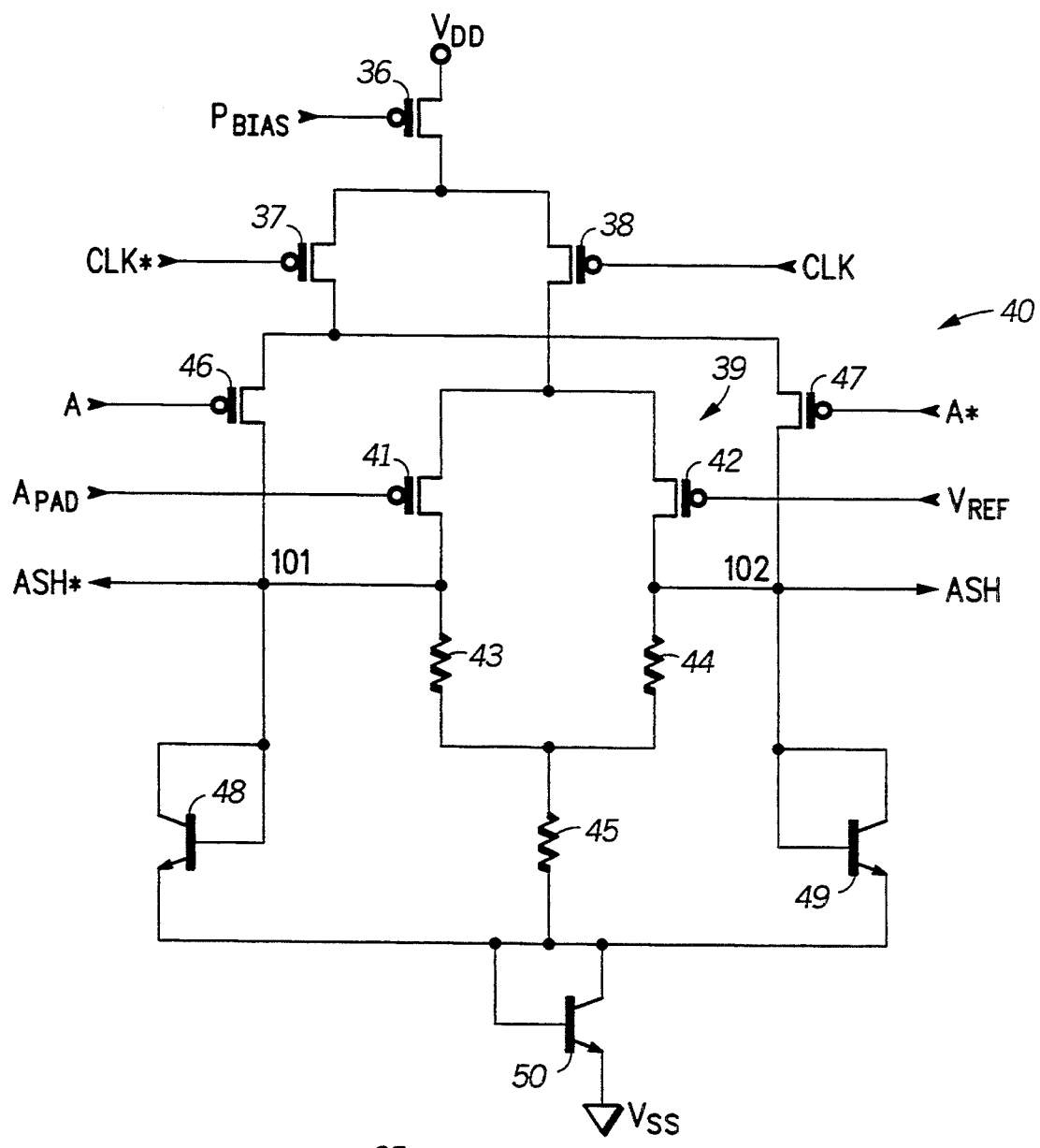
FIG. 2 illustrates in schematic diagram form, a level shifting circuit in accordance with the present invention.

The present invention can be more fully described with reference to FIGS. 2–FIG. 2 illustrates in schematic diagram form, level shifting circuit 35 in accordance with the present invention. Level shifting circuit 35 includes P-channel MOS (metal-oxide semiconductor) transistors 36, 37, 38, 41, 42, 46, and 47, resistors 43, 44, and 45, and diode-connected bipolar NPN transistors 48, 49, and 50. A differential pair 39 includes P-channel transistors 41 and 42, and a differential pair 40 includes P-channel transistors 46 and 47.

P-channel transistor 36 has a source connected to a power supply voltage terminal labeled "$V_{DD}$", a gate for receiving a bias voltage labeled "$P_{BIAS}$", and a drain. P-channel transistor 37 has a source connected to the drain of P-channel transistor 36, a gate for receiving a clock signal labeled "CLK*", and a drain. P-channel transistor 38 has a source connected to the drain of P-channel transistor 36, a gate for receiving a clock signal labeled "CLK", and a drain. Clock signals CLK and CLK* are differential clock signals. P-channel transistor 41 has a source connected to the drain of P-channel transistor 38, a gate for receiving an input signal labeled "$A_{PAD}$", and a drain for providing a level shifted input signal labeled "ASH*" at node 101. P-channel transistor 42 has a source connected to the drain of P-channel transistor 38, a gate for receiving a reference voltage labeled "$V_{REF}$", and a drain for providing a level shifted input signal labeled "ASH" at node 102. Resistor 43 has a first terminal connected to the drain of P-channel transistor 41 at node 101, and a second terminal. Resistor 44 has a first terminal connected to the drain of P-channel transistor 42 at node 102, and a second terminal connected to the second terminal of resistor 43. Resistor 45 has a first terminal connected to the second terminals of resistors 43 and 44, and a second terminal.

Figure 3:
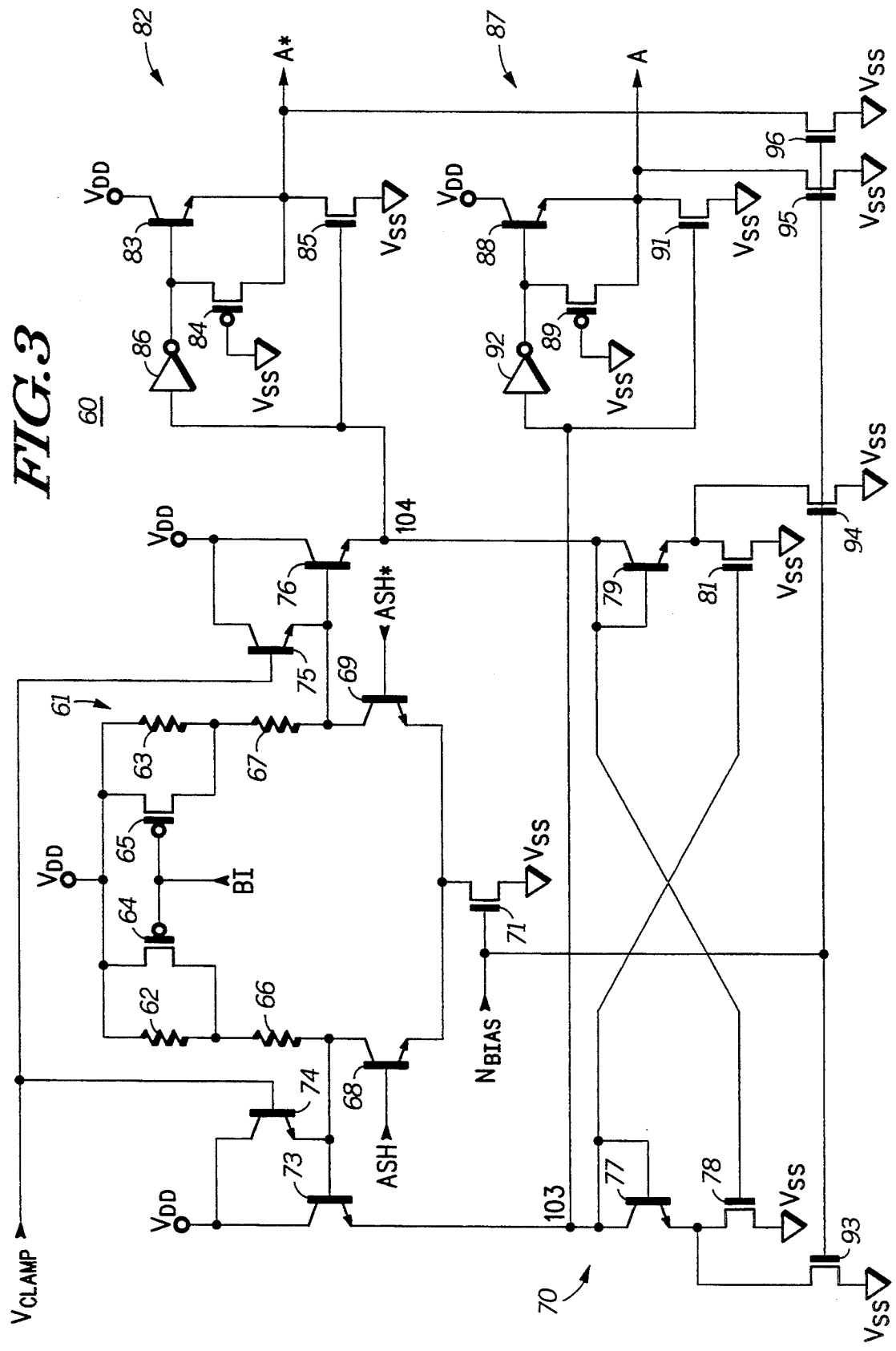
FIG. 3 illustrates in partial schematic diagram form and partial logic diagram form, a level converter circuit for use with the level shifting circuit of FIG. 2.

P-channel transistor 46 has a source connected to the drain of P-channel transistor 37, a gate for receiving an output signal labeled "A", and a drain connected to the drain of P-channel transistor 41 at node 101. P-channel transistor 47 has a source connected to the drain of P-channel transistor 37, a gate for receiving an output signal labeled "A*", and a drain connected to the drain of P-channel transistor 42 at node 102. Diode-connected NPN transistor 48 has a collector and a base both connected to the drain of P-channel transistor 41 at node 101, and an emitter connected to the second terminal of resistor 45. Diode-connected NPN transistor 49 has a collector and a base both connected to the drain of P-channel transistor 42 at node 102, and an emitter connected to the second terminal of resistor 45. Diode-connected NPN transistor 50 has a collector and a base both connected to the second terminal of resistor 45, and an emitter connected to a power supply voltage terminal labeled "$V_{SS}$". In the illustrated embodiment, power supply voltage terminal $V_{DD}$ receives a power supply voltage equal to about 3.3 volts, and power supply voltage terminal $V_{SS}$ is connected to ground. In other embodiments, the power supply voltages may be different. Output signals A and A* are differential signals provided as feedback signals to level shifting circuit 35 by level converter/buffer circuit 60 (FIG. 3).

Together, level shifting circuit 35 and level converter/buffer circuit 60 comprise an input stage for an integrated circuit. In a preferred embodiment, the input stage is part of an address buffer for a static random access memory (SRAM), and input signal $A_{PAD}$ is a GTL level address signal. Reference voltage $V_{REF}$ is set at about the midpoint of the desired logic swing of input signal $A_{PAD}$. Input signal $A_{PAD}$ is a GTL (Gunning transceiver logic) level signal and swings from a logic high voltage of about $V_{REF} + 0.2$ volts to a logic low voltage of about $V_{REF} - 0.2$ volts. Reference voltage $V_{REF}$ is typically between 0.6 volt and 1.0 volt. P-channel transistor 36 provides a current source for level shifting circuit 35 in response to receiving bias voltage $P_{BIAS}$. In other embodiments, level shifting circuit 35 and level converter/buffer circuit 60 (FIG. 3) may function as an input stage for receiving any type of input signal, such as a data signal, a control signal, or other type of signal which needs to be converted from GTL levels to BICMOS logic levels.

When clock signal CLK is a logic low voltage, clock signal CLK* is a logic high voltage, and P-channel transistor 38 is conductive, coupling differential pair 39 to P-channel transistor 36. P-channel transistor 37 is substantially nonconductive. If input signal $A_{PAD}$ is a logic low voltage, P-channel transistor 41 becomes relatively more conductive than P-channel transistor 42, and more current is steered through P-channel transistor 41 than through P-channel transistor 42. Level shifted input signal ASH* is provided at node 101 as a logic high voltage and level shifted input signal ASH is provided at node 102 as a logic low voltage. Conversely, if input signal $A_{PAD}$ is a logic high voltage, P-channel transistor 42 is relatively more conductive than P-channel transistor 41, and more current is steered through P-channel transistor 42 than through P-channel transistor 41. Level shifted input signal ASH is provided at node 102 as a logic high voltage and level shifted input signal ASH* is provided at node 101 as a logic low voltage. Level shifted input signals ASH and ASH* are then provided to level converter/buffer circuit 60 (FIG. 3) which level converts the intermediate levels of level shifted input signals ASH and ASH* to BICMOS logic level output signals A and A*. The logic states of output signals A and A* are the same as the logic states of level shifted input signals ASH and ASH*, respectively.

When clock signal CLK is a logic high voltage and clock signal CLK* is a logic low voltage, P-channel transistor 38 is substantially non-conductive and P-channel transistor 37 is conductive. Differential pair 39 is decoupled from P-channel transistor 36 and differential pair 40 is coupled to P-channel transistor 36. Output signals A and A* from level converter/buffer circuit 60 are provided to differential pair 40. In the case when level shifted input signals ASH and ASH* are provided as a logic high voltage and a logic low voltage, respectively, then output signal A is a logic high voltage and output signal A* is a logic low voltage. P-channel transistor 47 is relatively more conductive than P-channel transistor 46, causing node 102 to be maintained, or latched at a logic high voltage and node 101 to be maintained, or latched at a logic low voltage for the time period when clock signal CLK* is a logic low voltage. Note that in the illustrated embodiment, CLK and CLK* are clock signals. However, in other embodiments, signals CLK and CLK* may be control signals other than clock signals. Also, in other embodiments level shifting circuit 35 may be used without a latching function having feedback, which eliminates the need for differential pair 40 and P-channel transistors 37 and 38. If the latching function is not used, the drain of P-channel transistor 36 is connected directly to the sources of P-channel transistors 41 and 42.

The logic level voltages of level shifted signals ASH and ASH* are relatively independent of the logic level voltages of input signal $A_{PAD}$, and are therefore well controlled. Also, because the logic level voltages of level shifted signals ASH and ASH* are well controlled, NPN transistors 68 and 69 of level converter/buffer circuit 60 (FIG. 3) are less likely to operate in saturation.

Diode-connected NPN transistors 48 and 49 provide stability for level shifting circuit 35 by limiting the logic high voltage level to a predetermined upper limit. Diode-connected NPN transistor 50 provides noise reduction and voltage compensation. Note that in other embodiments, diode-connected NPN transistors 48, 49, and 50 may also be implemented as simple junction diodes rather than diode-connected transistors.

FIG. 3 illustrates in partial schematic diagram form and partial logic diagram form, level converter/buffer circuit 60 for use with level shifting circuit 35 of FIG. 2 in accordance with the present invention. Level converter 60 includes resistors 62, 63, 66, and 67, P-channel transistors 64, 65, 84 and 89, bipolar transistors 68, 69, 73, 74, 75, 76, 77, 79, 83, and 88, N-channel transistors 71, 78, 81, 85, 91, 93, 94, 95, and 96, and inverters 86 and 92. Differential amplifier 61 is formed by resistors 62, 63, 66, and 67, NPN transistors 68 and 69, and N-channel transistor 71. Output driver portion 82 includes NPN transistor 83, P-channel transistor 84, N-channel transistor 85 and inverter 86. Output driver portion 87 includes NPN transistor 88, P-channel transistor 89, N-channel transistor 91, and inverter 92. Diode-connected NPN transistors 77 and 79 and N-channel transistors 78 and 81 form cross-coupled half-latch 70. Resistors 62, 63, 66, and 67, and P-channel transistors 64 and 65 form a load network for differential amplifier 61.

Resistor 62 has a first terminal connected to $V_{DD}$, and a second terminal. Resistor 63 has a first terminal connected to $V_{DD}$, and a second terminal. P-channel transistor 64 has a source connected to $V_{DD}$, a gate for receiving a control signal labeled "BI", and a drain connected to the second terminal of resistor 62. P-channel transistor 65 has a source connected to $V_{DD}$, a gate for receiving control signal BI, and a drain connected to the second terminal of resistor 63. Resistor 66 has a first terminal connected to the second terminal of resistor 62, and a second terminal. Resistor 67 has a has a first terminal coupled to the second terminal of resistor 63, and a second terminal. NPN transistor 68 has a collector connected to the second terminal of resistor 66, a base for receiving level shifted input signal ASH, and an emitter. NPN transistor 69 has a collector connected to the second terminal of resistor 67, a base for receiving level shifted input signal ASH*, and an emitter connected to the emitter of NPN transistor 68. N-channel transistor 71 has a drain connected to the emitters of NPN transistors 68 and 69, a gate for receiving bias voltage $N_{BIAS}$, and a source connected to $V_{SS}$. NPN transistor 73 has a collector connected to $V_{DD}$, a base connected to the collector of NPN transistor 68, and an emitter at node 103. NPN transistor 74 has a collector connected to $V_{DD}$, a base for receiving a bias voltage labeled "$V_{CLAMP}$", and an emitter connected to the collector of NPN transistor 68. NPN transistor 75 has a collector connected to $V_{DD}$, a base for receiving bias voltage $V_{CLAMP}$, and an emitter connected to the collector of NPN transistor 69. NPN transistor 76 has a collector connected to $V_{DD}$, a base connected to the collector of NPN transistor 69, and an emitter at node 104.

Diode-connected NPN transistor 77 has a collector and a base both connected to the emitter of NPN transistor 73, and an emitter. Diode-connected NPN transistor 79 has a collector and a base both connected to the emitter of NPN transistor 76, and an emitter. N-channel transistor 78 has a drain connected to the emitter of diode-connected NPN transistor 77, a gate connected to the emitter of NPN transistor 76, and a source connected to $V_{SS}$. N-channel transistor 81 has a drain connected to the emitter of NPN transistor 79, a gate connected to the emitter of NPN transistor 73, and a source connected to $V_{SS}$. N-channel transistor 93 has a drain connected to the emitter of diode-connected NPN transistor 77, a gate for receiving bias voltage $N_{BIAS}$, and a source connected to $V_{SS}$. N-channel transistor 94 has a drain connected to the emitter of diode-connected NPN transistor 79, a gate for receiving bias voltage $N_{BIAS}$, and a source connected to $V_{SS}$.

Inverter 86 has an input terminal connected to the emitter of NPN transistor 76, and an output terminal. NPN transistor 83 has a collector connected to $V_{DD}$, a base connected to the output terminal of inverter 86, and an emitter for providing output signal A*. P-channel transistor 84 has a source connected to the base of NPN transistor 83, a gate connected to $V_{SS}$, and a drain connected to the emitter of NPN transistor 83. N-channel transistor 85 has a drain connected to the emitter of NPN transistor 83, a gate connected to the input terminal of inverter 86, and a source connected to $V_{SS}$.

Inverter 92 has an input terminal connected to the emitter of NPN transistor 73, and an output terminal. NPN transistor 88 has a collector connected to $V_{DD}$, a base connected to the output terminal of inverter 92, and an emitter for providing output signal A. P-channel transistor 89 has a source connected to the base of NPN transistor 88, a gate connected to $V_{SS}$, and a drain connected to the emitter of NPN transistor 88. N-channel transistor 91 has a drain connected to the emitter of NPN transistor 88, a gate connected to the input terminal of inverter 92, and a source connected to $V_{SS}$.

In operation, level converter 60 receives level shifted signals ASH and ASH* from level shifting circuit 35 of FIG. 2, and provides BICMOS level output signals A and A*. Level shifted signals ASH and ASH* are differential signals that swing between an intermediate logic high voltage of about 1.6 volts and an intermediate logic low voltage of about 1.0 volt. If level shifted signal ASH is an intermediate logic high and level shifted signal ASH* is an intermediate logic low, then a current through N-channel transistor 71 will be steered more through NPN transistor 68 and less through NPN transistor 69 so that the voltage at the base of emitter-follower NPN transistor 73 is reduced to a logic low. The voltage at the base of emitter-follower NPN transistor 76 is a logic high, causing a voltage at the emitter of NPN transistor 76 to be a logic high voltage.

N-channel transistor 78 is conductive, thus reducing the voltage at the emitter of NPN transistor 73 to a logic low voltage. Diode-connected NPN transistor 76 becomes substantially non-conductive when the voltage at the emitter of NPN transistor 73 is reduced to about one $V_{BE}$ above $V_{SS}$, causing N-channel transistor 78 to become substantially non-conductive and decreasing a current through N-channel transistor 78, thus reducing power consumption. The logic low voltage at the gate of N-channel transistor 81 is low enough to cause N-channel transistor 81 to be substantially non-conductive.

If level shifted signal ASH is an intermediate logic low and level shifted signal ASH* is an intermediate logic high, then a current through N-channel transistor 71 will be steered more through NPN transistor 69 and less through NPN transistor 68 so that the voltage at the base of emitter-follower NPN transistor 76 is reduced to a logic low. The voltage at the base of emitter-follower NPN transistor 73 is a logic high, causing a voltage at the emitter of NPN transistor 73 to be a logic high voltage.

N-channel transistor 81 is conductive, thus reducing the voltage at the emitter of NPN transistor 76 to a logic low voltage. Diode-connected NPN transistor 79 becomes substantially non-conductive when the voltage at the emitter of NPN transistor 76 is reduced to about one $V_{BE}$ above $V_{SS}$, decreasing a current through N-channel transistor 81, thus reducing power consumption. The logic low voltage at the gate of N-channel transistor 78 is low enough to cause N-channel transistor 78 to be substantially non-conductive.

At higher power supply voltages, control signal BI is provided as a logic high to the gates of P-channel transistors 64 and 65 to cause P-channel transistors 64 and 65 to be less conductive and therefore more resistive, to increase the load coupled to the collectors of NPN transistors 68 and 69. This prevents diode-connected NPN transistors 77 and 79 and N-channel transistors 85 and 91 (in output driver portions 82 and 87) from inadvertently becoming conductive as a result of the increased voltage levels. As the power supply voltage increases, the voltage at nodes 103 and 104 increases.

NPN transistors 74 and 75 provide a voltage clamp to ensure that NPN transistors 68 and 69 operate in the active region and do not go into saturation. Generally, a bipolar transistor operates in the saturation region when both the base-emitter and base-collector junctions are forward biased by more than approximately 0.7 volts. The base-collector junction of NPN transistors 68 and 69 may become forward biased as a result of any of several conditions. For example, if level shifted signals ASH and ASH* are allowed to increase to a high voltage level as a result of power supply fluctuations, NPN transistors 68 and 69 may operate in saturation. Also, if the drain-source current provided by N-channel transistor 71 is allowed to vary, the collector voltage of NPN transistors 68 or 69 may be increased enough to cause NPN transistors 68 and 69 to operate in saturation. Operating NPN transistors 68 and 69 in the active region provides the advantage of increased switching speeds.

Cross-coupled half-latch 70 provides an advantage of reduced power consumption. N-channel transistors 78 and 81 are cross-coupled and made conductive only when necessary to reduce the voltage of nodes 103 or 104 to a logic low. Diode-connected NPN transistors 77 and 79 further reduce power consumption by reducing a leakage current through N-channel transistors 78 and 81 and ensuring that either of N-channel transistors 78 and 81 remain substantially non-conductive when the voltage at the respective output node is a logic low. N-channel transistors 93 and 94 are provided to ensure that the voltage of nodes 103 and 104 remain at least a predetermined amount below the voltage of $V_{DD}$.

Output driver portions 82 and 87 are conventional BICMOS output drivers. In output driver portion 82, NPN transistor 83 functions as a pull-up transistor, and N-channel transistor 85 functions as a pull-down transistor. When the input terminal of inverter 86 receives a logic low voltage, inverter 86 provides a logic high to the base of NPN transistor 83. N-channel transistor 85 receives a logic low voltage and is substantially non-conductive. Output signal A* is pulled to a logic high voltage approximately equal to $V_{DD}$ minus one $V_{BE}$. P-channel transistor 84 prevents excessive reverse-biasing of the base-emitter junction of NPN transistor 83 when the voltage at the base of NPN transistor 83 is reduced to a logic low. Also, P-channel transistor 84 eventually increases the voltage of output signal A* to approximately equal to $V_{DD}$, eliminating the $V_{BE}$ voltage drop across NPN transistor 83. P-channel transistor 84 also helps to prevent NPN transistor 83 from operating in saturation and reduces a "crowbar" current through NPN transistor 83 and N-channel transistor 85.

When the input terminal of inverter 86 receives a logic high voltage, inverter 86 provides a logic low voltage to the base of NPN transistor 83. N-channel transistor 85 becomes conductive, causing output signal A* to be reduced to a logic low voltage approximately equal to $V_{SS}$. Output driver portion 87 is the same as output driver portion 82 and operates in the same manner. Note that output driver portions 82 and 87 are presented as an example of a BICMOS output driver circuit. There are various other output drivers circuits that can be substituted for output driver portions 82 and 87. N-channel transistors 95 and 96 limit the magnitude of the voltage of output signals A and A8 to increase margins.

Level shifting circuit 35, together with level converter/buffer circuit 60, provides the advantage of operation over a relatively wide range of values for reference voltage $V_{REF}$. Also, because the voltage levels of level shifted signals ASH and ASH* nearly independent of the common-mode voltage of input signal $A_{PAD}$ and are well controlled, bias voltage $V_{CLAMP}$ and NPN transistors 74 and 75 are not needed to prevent the saturation of NPN transistors 68 and 69 when level converter/buffer circuit 60 is used with level shifting circuit 35, even though they are illustrated in FIG. 3.

While the invention has been described in the context of a preferred embodiment, it will be apparent to those skilled in the art that the present invention may be modified in numerous ways and may assume many embodiments other than that specifically set out and described above. For example, level converter/buffer 60 may provide a single-ended output signal rather than the differential output signals illustrated in FIG. 3. Accordingly, it is intended by the appended claims to cover all modifications of the invention which fall within the true spirit and scope of the invention.

What is claimed is:

1. A level shifting circuit, comprising:
    a current source for providing a current;
    a first transistor having a first current electrode coupled to the current source, a control electrode for receiving an input signal, and a second current electrode for providing a first intermediate level signal;
    a second transistor having a first current electrode coupled to the first current electrode of the first transistor, a control electrode for receiving a reference voltage, and a second current electrode for providing a second intermediate level signal;
    a first load element having a first terminal coupled to the second current electrode of the first transistor, and a second terminal;

a second load element having a first terminal coupled to the second current electrode of the second transistor, and a second terminal coupled to the second terminal of the first load element;

a third load element having a first terminal coupled to the second terminals of both the first and second load elements, and a second terminal;

a first diode having a first terminal coupled to the second current electrode of the first transistor, and a second terminal coupled to the second terminal of the third load element;

a second diode having a first terminal coupled to the second current electrode of the second transistor, and a second terminal coupled to the second terminal of the third load element; and a third diode having a first terminal coupled to the second terminal of the third load element, and a second terminal coupled to a power supply voltage terminal.

2. The level shifting circuit of claim 1, wherein the first and second transistors are each P-channel MOS transistors.

3. The level shifting circuit of claim 1, wherein the first, second, and third diodes are bipolar transistors.

4. The level shifting circuit of claim 1, further comprising:

a third transistor having a first current electrode coupled to a first terminal of the current source, a control electrode for receiving a first clock signal, and a second current electrode;

a fourth transistor having a first current electrode coupled to the first terminal of the current source, a control electrode for receiving a second clock signal, and a second current electrode coupled to the first current electrodes of both of the first and second transistors;

a fifth transistor having a first current electrode coupled to the second current electrode of the third transistor, a control electrode for receiving a first feedback signal, and a second current electrode coupled to the second current electrode of the first transistor; and a sixth transistor having a first current electrode coupled to the second current electrode of the third transistor, a control electrode for receiving a second feedback signal, and a second current electrode coupled to the second current electrode of the second transistor.

5. The level shifting circuit of claim 4, wherein the third, fourth, fifth, and sixth transistors are each a P-channel MOS transistor.

6. The level shifting circuit of claim 4, wherein a logic state of the second clock signal is a logical complement of a logic state of the first clock signal.

7. The level shifting circuit of claim 4, further comprising a level converter circuit, the level converter circuit having first and second input terminals coupled to the second current electrodes of the first and second transistors, respectively, and first and second output terminals coupled to the control electrodes of the fifth and sixth transistors.

8. The level shifting circuit of claim 1, wherein the first, second, and third load elements are characterized as being resistors.

9. A latching level shifting circuit, comprising:

a current source having a first terminal coupled to a first power supply voltage terminal, and a second terminal;

a first transistor having a first current electrode coupled to the second terminal of the current source, a control electrode for receiving a first clock signal, and a second current electrode;

a second transistor having a first current electrode coupled to the second terminal of the current source, a control electrode for receiving a second clock signal, and a second current electrode;

a third transistor having a first current electrode coupled to the second current electrode of the second transistor, a control electrode for receiving an input signal, and a second current electrode for providing a first intermediate level signal;

a fourth transistor having a first current electrode coupled to the first current electrode of the third transistor, a control electrode for receiving a reference voltage, and a second current electrode for providing a second intermediate level signal;

a fifth transistor having a first current electrode coupled to the second current electrode of the first transistor, a control electrode for receiving a first feedback signal, and a second current electrode coupled to the second current electrode of the third transistor;

a sixth transistor having a first current electrode coupled to the second current electrode of the first transistor, a control electrode for receiving a second feedback signal, and a second current electrode coupled to the second current electrode of the fourth transistor;

a first load element having a first terminal coupled to the second current electrode of the third transistor, and a second terminal;

a second load element having a first terminal coupled to the second current electrode of the fourth transistor, and a second terminal coupled to the second terminal of the first load element;

a third load element having a first terminal coupled to the second terminals of both the first and second load elements, and a second terminal;

a first diode having a first terminal coupled to the second current electrode of the third transistor, and a second terminal coupled to the second terminal of the third load element;

a second diode having a first terminal coupled to the second current electrode of the fourth transistor, and a second terminal coupled to the second terminal of the third load element; and a third diode having a first terminal coupled to the second terminal of the third load element, and a second terminal coupled to a second power supply voltage terminal.

10. The latching level shifting circuit of claim 9, wherein the first, second, third, fourth, fifth, and sixth transistors are P-channel transistors.

11. The latching level shifting circuit of claim 10, wherein the first, second, and third diodes are diode connected bipolar transistors.

12. The latching level shifting circuit of claim 10, wherein the load elements are characterized as being resistors.

13. A latching GTL compatible BICMOS input stage, comprising:

a current source having a first terminal coupled to a first power supply voltage terminal, and a second terminal;

a first P-channel transistor having a first current electrode coupled to the second terminal of the current source, a control electrode for receiving a first clock signal, and a second current electrode;

a second P-channel transistor having a first current electrode coupled to the second terminal of the current source, a control electrode for receiving a second clock signal, and a second current electrode;

a third P-channel transistor having a first current electrode coupled to the second current electrode of the second P-channel transistor, a control electrode for receiving an input signal, and a second current electrode for providing a first intermediate level signal;

a fourth P-channel transistor having a first current electrode coupled to the first current electrode of the third P-channel transistor, a control electrode for receiving a reference voltage, and a second current electrode for providing a second intermediate level signal;

a fifth P-channel transistor having a first current electrode coupled to the second current electrode of the first P-channel transistor, a control electrode for receiving a first feedback signal, and a second current electrode coupled to the second current electrode of the third P-channel transistor;

a sixth P-channel transistor having a first current electrode coupled to the second current electrode of the first P-channel transistor, a control electrode for receiving a second feedback signal, and a second current electrode coupled to the second current electrode of the fourth P-channel transistor;

a first resistor having a first terminal coupled to the second current electrode of the third P-channel transistor, and a second terminal;

a second resistor having a first terminal coupled to the second current electrode of the fourth P-channel transistor, and a second terminal coupled to the second terminal of the first resistor;

a third resistor having a first terminal coupled to the second terminals of both the first and second resistors, and a second terminal;

a first diode-connected transistor having a first terminal coupled to the second current electrode of the third P-channel transistor, and a second terminal coupled to the second terminal of the third resistor;

a second diode-connected transistor having a first terminal coupled to the second current electrode of the fourth P channel transistor, and a second terminal coupled to the second terminal of the third resistor; and a third diode-connected transistor having a first terminal coupled to the second terminal of the third resistor, and a second terminal coupled to a second power supply voltage terminal.

14. The latching GTL compatible BICMOS input stage of claim 13, further comprising a level converter circuit, the level converter circuit having first and second input terminals coupled to the second current electrodes of the third and fourth P-channel transistors, respectively, and first and second output terminals coupled to the control electrodes of the fifth and sixth P-channel transistors, respectively.

* * * * *